(12) United States Patent
Ovadia

(10) Patent No.: US 10,295,596 B1
(45) Date of Patent: *May 21, 2019

(54) METHOD AND SYSTEM FOR GENERATING VALIDATION TESTS

(71) Applicant: Cadence Design Systems, Inc., San Jose, CA (US)

(72) Inventor: Meir Ovadia, Rosh Ha-Aayin (IL)

(73) Assignee: Cadence Design Systems, Inc., San Jose, CA (US)

( * ) Notice: Subject to any disclaimer, the term of this patent is extended or adjusted under 35 U.S.C. 154(b) by 30 days.

This patent is subject to a terminal disclaimer.

(21) Appl. No.: 15/672,299

(22) Filed: Aug. 9, 2017

(51) Int. Cl.
*G06F 17/50* (2006.01)
*G01R 31/3183* (2006.01)
*G01R 31/3177* (2006.01)

(52) U.S. Cl.
CPC . *G01R 31/318307* (2013.01); *G01R 31/3177* (2013.01)

(58) Field of Classification Search
CPC ........ G01R 31/3177; G01R 31/318307; G01R 31/318342; G06F 17/5009; G06F 17/5027; G06F 17/504; G06F 17/5036
USPC .................................................. 716/106, 136
See application file for complete search history.

(56) References Cited

U.S. PATENT DOCUMENTS

2015/0301108 A1* 10/2015 Hamid ............... G01R 31/3177
714/724
2018/0157574 A1* 6/2018 Mitra .................. G06F 11/3003

\* cited by examiner

*Primary Examiner* — Paul Dinh
(74) *Attorney, Agent, or Firm* — Pearl Cohen Zedek Latzer Baratz LLP

(57) ABSTRACT

A method for generating a validation test may include using a processor, identifying, in a scenario for validation testing, a plurality of actions that address a single resource in a conflicting manner; and automatically generating target code of the scenario that includes one or a plurality of resource management commands so as to prevent conflicting addressing of that resource by said plurality of actions.

9 Claims, 10 Drawing Sheets

Using a processor, identify, in a scenario for validation testing, a plurality of actions that address a single resource in a conflicting manner
402

Automatically generate target code of the scenario that includes one or a plurality of resource management commands so as to prevent conflicting addressing of that resource by said plurality of actions
404

METHOD AND SYSTEM FOR GENERATING VALIDATION TESTS

FIELD OF THE INVENTION

The present invention relates to system testing. More specifically, the present invention relates to a method and system for generating post-silicon or other validation tests.

BACKGROUND

Design verification is a common process for testing a newly designed integrated circuit, board, or system-level architecture, to confirm that it complies with the requirements defined by the specification of the architecture for that device. Design verification for a device under test (DUT) may be performed on the actual device, but usually a simulation model of the device is tested.

Verification of electronic designs has typically three forms. At an early stage, before the electronic design is implemented in hardware, simulation is conducted on a model of the design. Another form is emulation, in which one electronic hardware is used to mimic the behavior of another (tested) electronic hardware. At more advanced stages of design development a system on chic is validated, in a process which is typically referred to as post-silicon validation. Post-silicon validation is the last stage in the electronic design development, before it is manufactured.

Post-silicon validation tests are carried out on actual devices running at speed on realistic system boards, the results of which are assessed by a logic analyzer and other validation tools.

SUMMARY

There is thus provided, according to some embodiments of the present invention, a method for generating a validation test. The method may include, using a processor, identifying, in a scenario for validation testing, a plurality of actions that address a single resource in a conflicting manner. The method may also include automatically generating target code of the scenario that includes one or a plurality of resource management commands so as to prevent conflicting addressing of that resource by said plurality of actions.

In some embodiments of the invention, the method may include representing the scenario for validation testing in an abstract representation.

In some embodiments, the validation test may be a post silicon validation test.

In some embodiments of the invention, the scenario may be a combined scenario and wherein the plurality of actions may include actions in different scenarios of the combined scenario.

In some embodiments said one or a plurality of resource management commands may include one or more lock commands.

In some embodiments the lock commands may be selected from the group consisting of an exclusive lock command, a shared lock command and a free command.

In some embodiments there is also provided a non-transitory computer readable storage medium for generating a validation test, having stored thereon instructions that when executed by a processor will cause the processor to: identify, in a scenario for validation testing, a plurality of actions that address a single resource in a conflicting manner; and automatically generate target code of the scenario that includes one or a plurality of resource management commands so as to prevent conflicting addressing of that resource by said plurality of actions.

According to some embodiments of the invention, there is also provided a system for generating a validation test. The system may include a memory and a processor configured to: using a processor, identify, in a scenario for validation testing, a plurality of actions that address a single resource in a conflicting manner; and automatically generate target code of the scenario that includes one or a plurality of resource management commands so as to prevent conflicting addressing of that resource by said plurality of actions.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

FIG. 4 illustrates a method for generating post-silicon validation tests, according to some embodiments of the invention.

DETAILED DESCRIPTION OF EMBODIMENTS OF THE INVENTION

Figure 1:
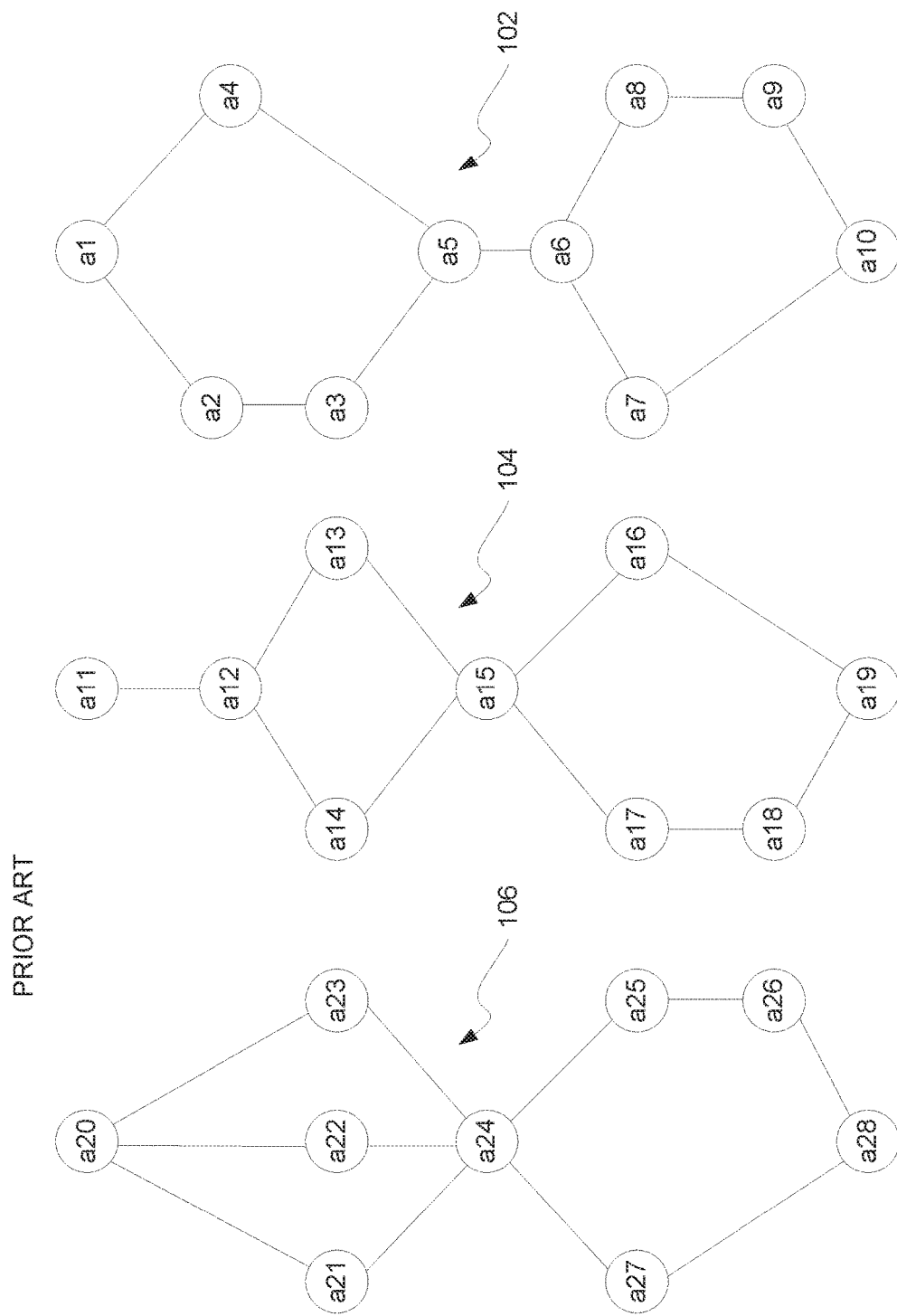
FIG. 1 illustrates three examples of validated scenarios—"solutions"—(prior art) originally constructed for use in simulation.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Scenario generally refers to a set of actions put together by a validation expert ("user") that is to be tested on the DUT. A valid scenario (a scenario that the DUT is meant to perform flawlessly) is generally referred to as "solution". After a solution is established it may be converted into a test (converted to executable code, such as, for example, C-code or Assembly). For brevity, we refer hereinafter to scenarios, but it should be understood that in the context of the present specification these terms (scenario, solution and test) are practically exchangeable unless stated otherwise.

An electronic system (e.g., a smartphone) is typically made up of a plurality of electronic devices (e.g., memory, camera, central processing unit—CPU, graphical processing unit—GPU, microphone, media player, etc.). At the early stages in the development of electronic design, a model of each of the electronic devices that form the electronic system is built (typically in Verilog or other HDL language and verified, by simulating executions of a multitude of tests on the on a simulation of the device under test (DUT). In order to efficiently cover all functionalities of the DUT a plurality of tests are generated (which are pieces of code, e.g., C-code, assembly), each of the tests based on one of a various scenarios which are constructed by a one or a plurality of users (hereinafter "user" or "users"). Each scenario is made up of a plurality of actions which the user selects to be included in the scenario. The user also defines the order in which the selected actions are to be performed—consecutively or concurrently. "Consecutively" means that actions are performed one at a time, the next action performed only after the previous action was completed, whereas "concurrently" means that two (or more) actions may be carried out within a prescribed timeframe, and only after completion of all concurrent actions the next consecutive action or actions may be performed.

Recently a tool was developed that allows a user to construct an abstract scenario by dragging actions (actually symbols of such actions) from a set of available actions into a designated space in a graphical user interface, defining the relations between the selected actions (the order in which they are to be performed—e.g., sequentially or in parallel), and generating a test code from the constructed scenario.

FIG. 1 illustrates three examples, 102,104 and 106, of validated scenarios—"solutions"—(prior art) that were originally constructed for use in simulation. Scenarios are constructed by verification experts to include a plurality of actions (a1, a2, a3, etc.) which are to be used for testing a DUT. The actions in a scenario are arranged in an orderly manner (as suggested in the graph representation of the scenario) defining the order in which the actions are to be performed. Some actions are meant to be executed consecutively, such as, for example, a1-a2-a3-a5 (in scenario 102), while some actions are to be executed concurrently, such as, for example, a13 and a14 in scenario 104. By "concurrent execution" of actions is not necessarily meant that these actions are performed simultaneously (but that may happen as well), rather it means that concurrently executed actions must all be completed before moving to the next action or actions.

In principle the same valid scenarios may be used in simulation, in emulation or in post-silicon validation, but the run time of a test that is generated from the same scenario in simulation, in emulation or in post-silicon validation vary greatly. Just to comprehend the scales involved, a test that runs for about a minute in post-silicon validation (e.g., booting up a smartphone) may take a few days to run in simulation. Thus a test that runs for a few hours in simulation only runs for a few seconds in the post-silicon validation stage.

Validated scenarios ("solutions") that were originally designed for simulation or emulation, may also be used in constructing tests for post-silicon validation. Such approach requires minimal effort from the user who can utilize scenarios that were originally constructed for the simulation stage, in the post-silicon validation stage. It is generally understood that users are interested in generating tests that would run a reasonable length of time and challenge the various components of a system on chip (SOC) in post-silicon validation.

A method for validating post-silicon SOC (which typically may be employed by a test generator of a post-silicon validation tool) includes selecting validated scenarios (solutions) that were originally designed for generating simulation tests of components of that SOC, combining them into a combined scenario, and generating from the combined scenario a validation test. The combined scenario is made up of a plurality of the selected solutions and after validating it (solving) it is used for generating a combined test configured to execute the plurality of the selected scenarios in parallel (concurrently) on the SOC.

In the process of constructing the combined scenario, validated scenarios addressing a single resource of the SOC, in a manner that is beyond a valid limitation of that resource (e.g., two actions addressing a device, such as the camera, that can be addressed only sequentially, or requiring more than a valid number of USB connections), may be excluded and not included in the combined scenario.

In the process of constructing the combined scenario, scenarios concurrently addressing a single resource, in a manner that is beyond a valid limitation of that resource, may be excluded and not included in the combined scenario, but scenarios that address the same resource at different times may be included in the combined scenario.

Figure 2A:
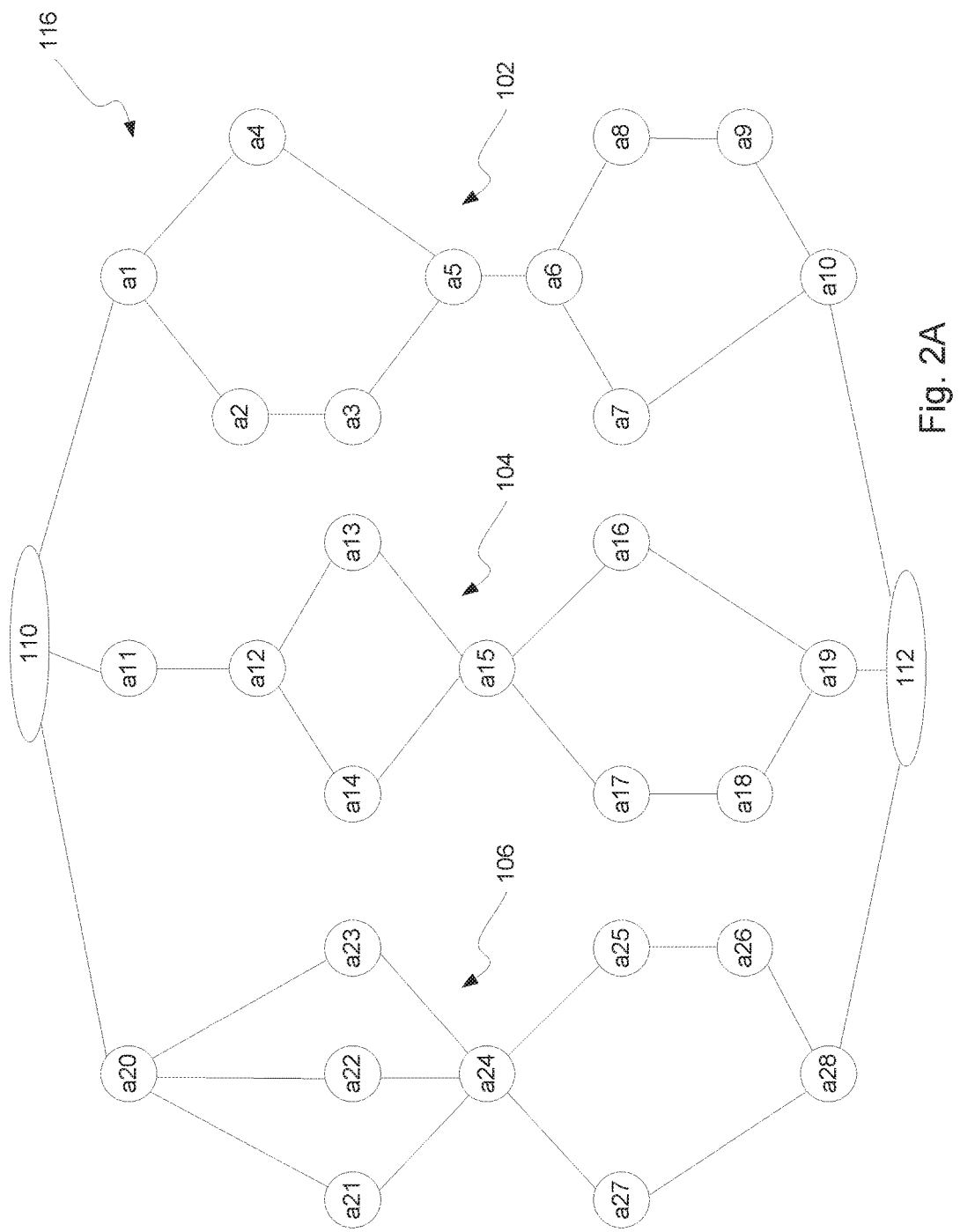
FIG. 2A illustrates a combined scenario for a post-silicon validation test according to some embodiments of the present invention.

FIG. 2A illustrates a combined scenario 116 for a post-silicon validation test according to some embodiments of the present invention. The combined scenario 116 includes three selected validated scenarios (solutions), 102, 104 and 106. The combined scenario, when converted into a test, would cause parallel concurrent execution of the three validated scenarios starting 110 with the first actions, a1, a11 and a20, and terminating 112, after completion of the last three parallel actions a10, a19 and a28. While the combined scenario depicted in this figure combines three scenarios, a combined scenario may include other numbers of scenarios.

Typically, according to some embodiments of the invention, a plurality of combined scenarios are constructed so as to generate a plurality of post-silicon validation tests. Such tests exhibit a variety of combined scenario, aimed at covering many versatile combined scenarios, thus testing various components of the SOC under different test scenarios.

When dealing with scenarios that were originally designed for simulation, typical run time of such scenarios, when performed in the post-silicon validation stage is in the order of one or a few seconds.

Figure 2B:
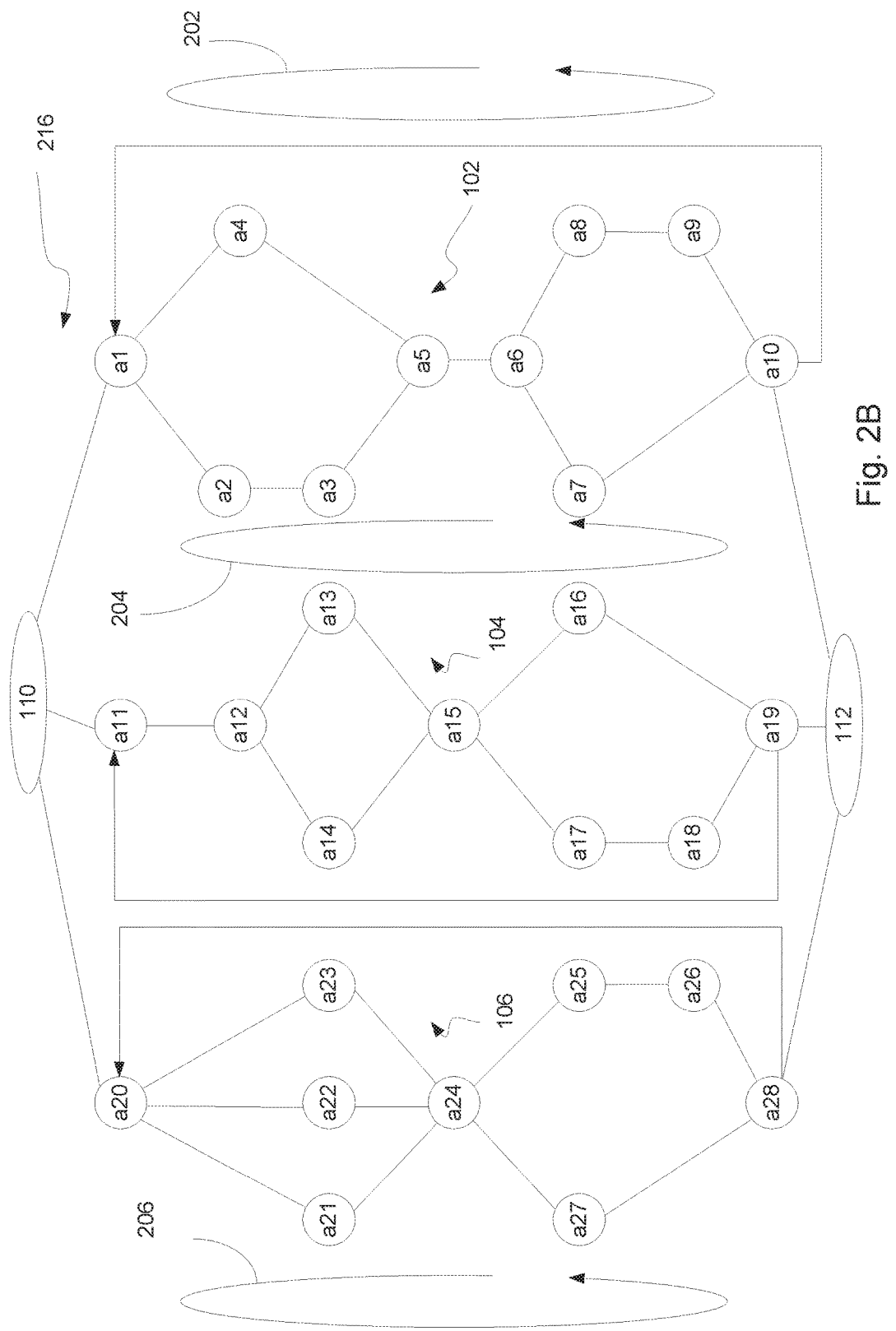
FIG. 2B illustrates a combined scenario for a post-silicon validation test according to some embodiments of the present invention that includes valid scenarios configured to be repeated in loops.

Thus, according to some embodiments of the present invention, each of the plurality of scenarios forming the combined scenario may configured to be repeated in loops, as shown in FIG. 2B. Each of the scenarios—102, 104 and 106, of the combined scenario 216, upon completion, is rerun again and again in a predetermined number of loops 202, 204 and 206, respectively.

Typically different scenarios have different run times, which depends on the number and type of the various actions included in each scenario.

Figure 2C:
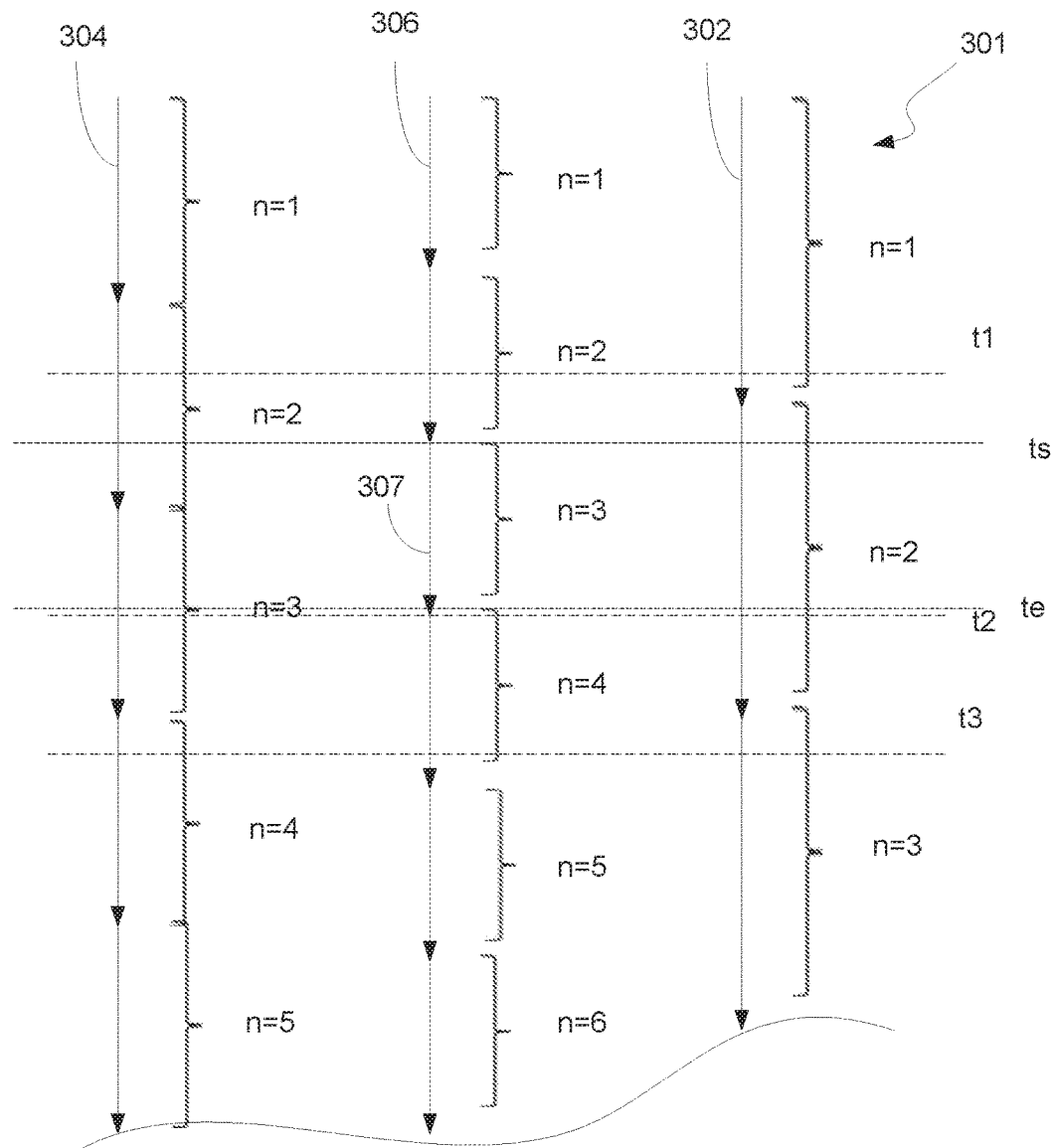
FIG. 2C illustrates time lines of the looped scenarios of a combined scenario, according to some embodiments of the present invention, in which each scenario is configured to be repeated in loops of predetermined number.

FIG. 2C illustrates time lines of the looped scenarios of a combined scenario 301, according to some embodiments of the present invention, in which each scenario is configured to be repeated in loops of predetermined number (the number of loops of each scenario in the combined scenarios may vary). The scenario of time line 302 (presented by an arrow) has a run time which is the longest among the displayed scenarios. The scenario presented by time line 304 has a shorter run time than the scenario of time line 302, but longer than the scenario presented in time line 308. The time lines in this figure are truncated for brevity. The number "n" of loops each scenario is configured to run may vary. It is evident that as time progresses the current execution state (the current combinations of actions performed at a current instance) during the execution of the combined test changes constantly, thereby increasing the versatility of the test instances. For example, at test instance t1 (denoted by the dashed line) the scenario of time line 302 is about to end its first run (n=1), while the scenario of timeline 306 is nearing a second run (n=2) completion, and the scenario of time line 304 is at the first half of the second run (n=2). At a second test instance t2 the scenario of time line 302 is in the second half of its second run (n=2), while the scenario of timeline 306 is just starting a fourth run (n=4), and the scenario of time line 304 has just completed half of the third run (n=3). At a third test instance t3 the scenario of time line 302 is in the first half of its third run (n=3), while the scenario of timeline 306 is about to send the fourth run (n=4), and the scenario of time line 304 is at the beginning of the fourth run (n=4). As a result of looping the scenarios of the combined scenario, the testing conditions constantly change, offering longer and more diverse tests, which are of greater interest to the user.

Thus, in accordance with some embodiments of the present invention a user is able to generate a rich and diverse test in the post-silicon validation stage, with minimal effort. Instead of constructing new tests from scratch, the user can utilize, in the construction of a post-silicon validation test, the plurality of simulation scenarios that were previously constructed (in the simulation stage), combine a plurality of simulation scenarios, set the number of times the scenarios in the combined scenario are to be rerun and generate thereafter the combined test.

Figure 2D:
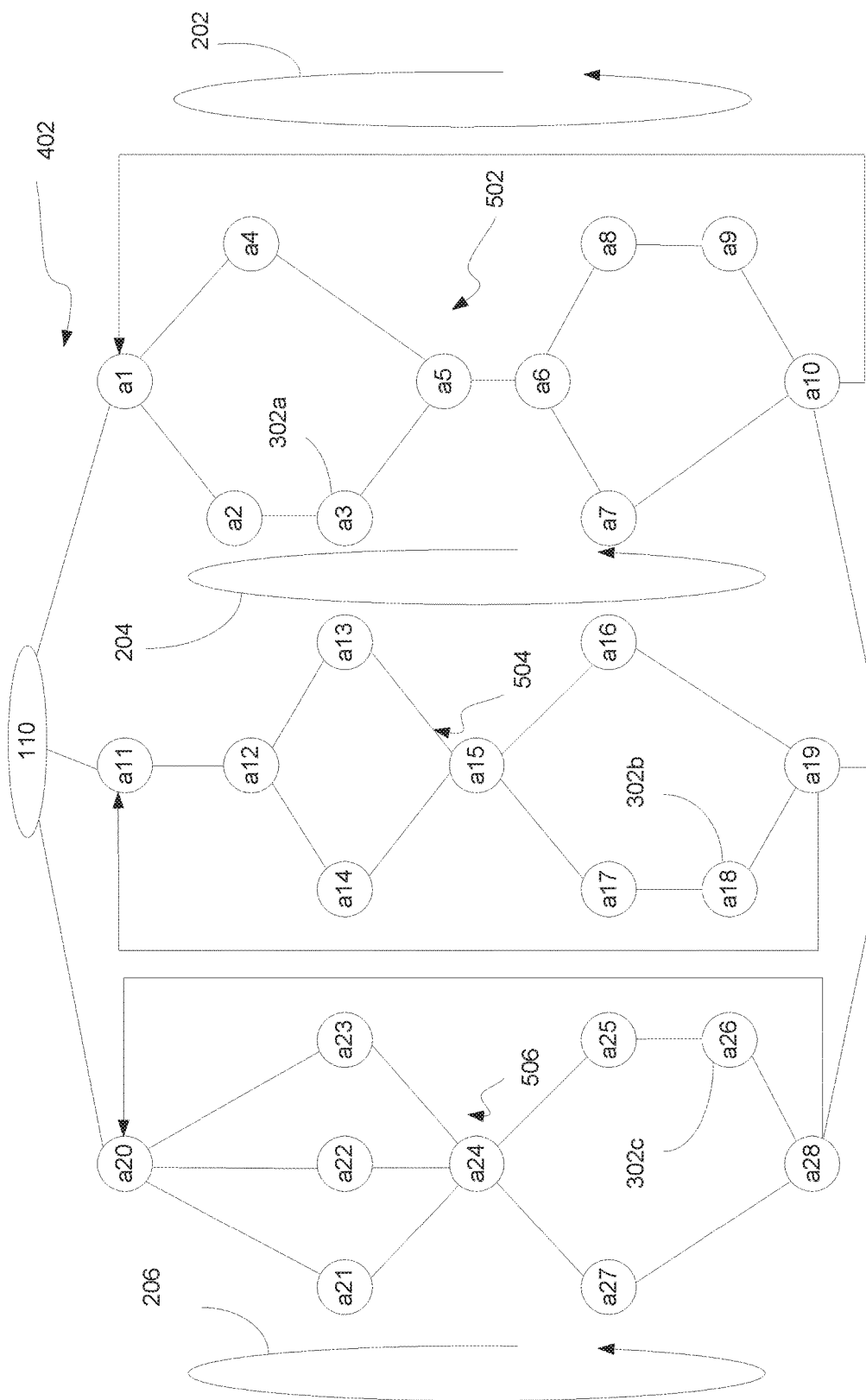
FIG. 2D illustrates a combined scenario for a post-silicon validation test according to some embodiments of the present invention that includes valid scenarios configured to be repeated in loops, wherein one or more of the actions included in the combined scenario are changed in each loop.

FIG. 2D illustrates a combined scenario 402 for a post-silicon validation test according to some embodiments of the present invention that includes valid scenarios 402, 404 and 406, configured to be repeated in loops, wherein one or more of the actions included in the combined scenario are changed in each loop.

In the example depicted in FIG. 2D each of the three scenarios 502, 504 and 506, includes an action (action 302*a*, action 302*b* and action 302*c*, respectively) which it is desired to change for each looped run. These actions may be, for example write commands (that typically include, each, a value and an address in memory into which the value is to be written). Without intervening as described hereinafter, in the conversion of the combined scenario into a test, the same value will be assigned in the final code to be written by the write command in each of the looped runs of the scenarios that includes these actions.

Therefore, in accordance with some embodiments of the present invention, before the generation of the combined test, the user adds to the appropriate scenario a command that is designed to produce a plurality of values during the generation of the combined test, such that the generated combined test causes different values to be written during the execution of the test code in the post-silicon validation stage. For example, in some embodiments, a user may set per a scenario or a solution a loop-counter with a value 'X' and the test generation tool automatically generates 'X' values per each generated/exported attribute/field (e.g. 'constraint loop-counter==X'). In some embodiments the test generation tool generates legal values for 'X' in compliance with one or more constraints. Consider, for example the following pseudo-code:

action A {
value1: byte;
value2: byte;
constraint value1>=0;
constraint value1+value2==10;
};

In the above example if attributes 'value1' and 'value2' are exported to the C code (the generated test) then the tool is configured to generate 'X' legal values for 'value1' and 'value2' (not necessarily unique values)—i.e. assuming the C side is implemented as 'C array of size X' then 'value1[i]' match 'value2[i]' for each 'i' in [0 . . . X−1].

Figure 3:
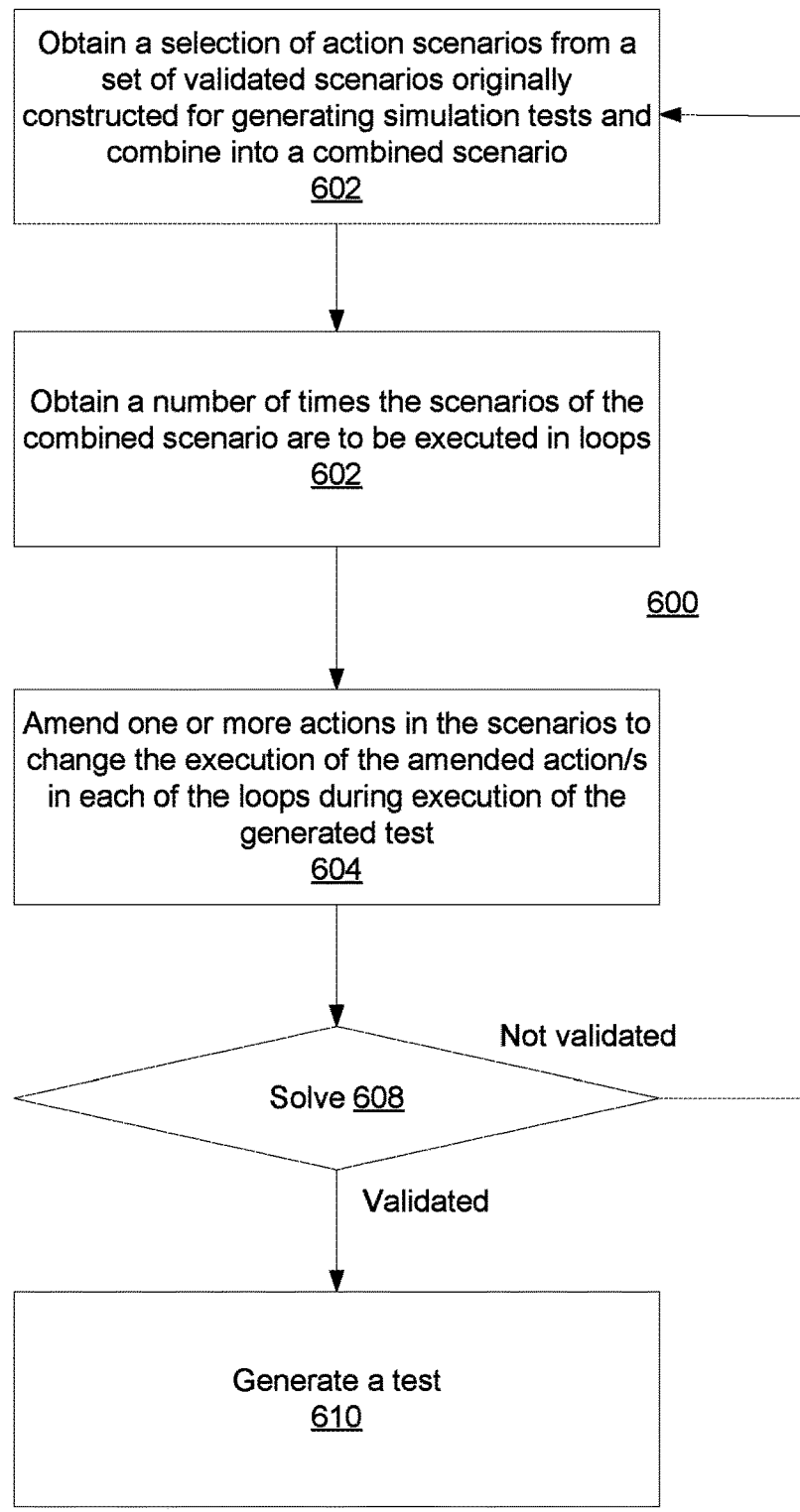
FIG. 3 illustrates a method for generating a post-silicon validation test, according to some embodiments of the present invention.

FIG. 3 illustrates a method 600 for generating a post-silicon validation test, according to some embodiments of the present invention.

Method 600 includes obtaining 602 a selection of scenarios from a set of validated scenarios (solutions) originally constructed for generating simulation tests (tests of DUTs that form components of an SOC to be tested in post silicon validation stage), and combine them into a combined scenario. Method 600 may also include obtaining 604 a number of times the scenarios of the combined scenario are to be executed in loops.

Method 600 may also include amending one or more actions in the scenarios of the combined scenario to change the execution of the amended action or actions in each of the loops during execution of the generated post-silicon validation test.

Then, the combined scenario is solved 608 by a tool solver. If the output solution is not validated the above method steps are repeated to construct another combined scenario. If the solver output is validated a test is generated from the combined scenario.

In the process of constructing the combined scenario, validated scenarios may be found that address a single resource of the SOC, and according to the description above in order to avoid resource conflict (conflicting addressing of the same resource) it was suggested to exclude such validated scenarios and not include them in the combined scenario.

However, there is a way to allow the inclusion of such validated scenarios in the combined scenario, as is explained hereinafter.

Two or more actions, of different validated scenarios, may be found that address the same resource. This may be, for example, addressing the same address in memory, addressing a camera, a microphone or any other resource of the tested SOC.

According to some embodiments of the invention, runtime resource management may be applied, such as in the manner described hereinafter.

FIG. 4 illustrates a method 400 for generating a validation test, according to some embodiments of the invention. Method 400 may include using a processor, identifying 402, in a scenario for validation testing, a plurality of actions that address a single resource in a conflicting manner. Method 400 may further include automatically generating 404 target code of the scenario that includes one or a plurality of resource management commands so as to prevent conflicting addressing of that resource by said plurality of actions.

A combined scenario for post-silicon validation testing, may include a plurality of validated scenarios, a plurality (two or more) of actions in different scenarios of the validated scenarios may address the same resource in a conflicting manner. For example, consider the abstract presentation of the combined scenario shown in FIG. 2D. Actions a13 and a14 in scenario 504, or action a23 in scenario 506 and action a5 in scenario 502 may concurrently address the same resource during execution.

Typically, a post-silicon validation tool may hold information on each action of the combined scenario. Such information may include, for example, identity of the resource of the target machine (e.g., SOC) on which that action is to be executed.

Thus, the post-silicon validation tool may be configured to review the combined scenario, for example, by reviewing an abstract representation of the combined scenario, to identify actions in different scenarios of the combined scenario that address the same resource in a conflicting manner. The conflicting manner may be, for example, addressing the same resource by different actions that are supposed to be executed or may be executed concurrently. "Concurrently" may imply simultaneous execution or execution within a time frame of predetermined length, or other condition that suggests possible conflicts in addressing of the same resource by these actions.

If actions of different scenarios that are identified to address the same resource in a conflicting manner are found then method 400 may further include automatically generating target code of the combined scenario that include resource management commands so as to prevent conflicting addressing of that resource. The validation tool may be configured to cause the resource management commands to be added to a target code that is generated of the combined scenario.

The resource management commands that may be used correspond to the platform (e.g., simulator, post-silicon SOC, Acron RISC Machine—ARM, etc.) on which the target code is to be executed.

A "lock" function is a resource management command designed to enforce limitations on access to a resource. A "lock" is typically designed to enforce a mutual exclusion concurrency control policy.

For example, there are several types of "lock" commands that are designed to restrict access and use of a resource under certain conditions and in a certain manner.

An "exclusive lock" command, typically associated with "write" actions, causes a resource to become exclusively available to one addressing action, while preventing any other concurrent action from accessing that resource. Only after a "free" command is issued the exclusively locked resource becomes available for access again. If a resource is exclusively locked then shared locks or other exclusive locks cannot be obtained. A "shared lock" initially locks the resource to allow the locking action to access that resource but allows a plurality of actions, later, to access the resource. If one or more shared locks exist, exclusive locks may not be obtained.

According to some embodiments of the present invention, a user may be prompted, or otherwise allowed to select or indicate a desired resource management command (e.g., "exclusive lock", or "shared lock") to be associated with particular action or actions.

According to some embodiments of the invention, the validation tool may automatically generate target code of the combined scenario that includes resource management commands so as to prevent conflicting addressing of that resource.

According to some embodiments of the invention, the validation tool may cause an abstract representation of a target code to be presented on a display device to a user. And a user may indicate for specific action or actions what type of resource management command may be applied to that action. For example, consider the following pseudo code relating to a target code, where A1 and A2 (and B1 and B2 and D1 and D2, respectively) are different instances of the same action A in different scenarios of a combined scenario or of the same scenario, and where B1 and B2 have been identified as potentially conflicting actions prone to concurrent addressing of the same resource R1 ("some code" refers to specific code that is part of the designated action, and is typically different for each action):

```
Main( )
  run A1( )
  run B1( )
  run D1( )
  run A2( )
  run B2( )
  run D2( )
A1 ( )
  Some code
B1 ( )
  Lock (R1)
  Some code
  Free (R1)
D1 ( )
  Some code
A2 ( )
  Some code
B2 ( )
  Lock (R1)
  Some code
  Free (R1)
D2 ( )
  Some code
```

In the above example, a user has added resource management commands of a specific kind—an exclusive lock command and a corresponding free command. In other examples, other resource management commands may be used, as appropriate and/or desired by the user.

Thus, when the validation tool generates a target code of the combined scenario, the resource management commands become embedded in the runtime target code, affecting runtime resource management.

Similarly, if an exclusive lock action is present in the combined scenario then a corresponding freeing action may be selected by the user, to facilitate additional use of that resource by other actions.

The validation tool applies the user defined commands to the generated target code, which is then used for execution on the SOC (or other deign under test—DUT).

While the above description of some embodiments of the present invention relates to post-silicon validation testing, which involves the use of combined scenarios for testing, it is asserted that a method according to some embodiments of the invention may be implemented in simulation (where the conflicting actions are included in a single scenario (and not in different scenarios of a combined scenario).

Figure 5:
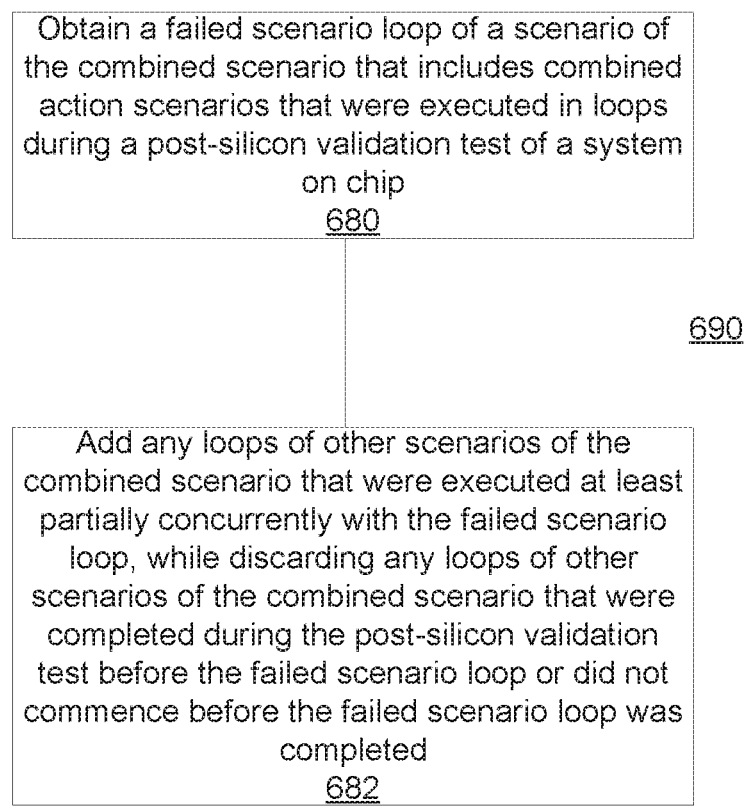
FIG. 5 illustrates a system for generating a post-silicon validation test, according to some embodiments of the present invention.
Figure 6:
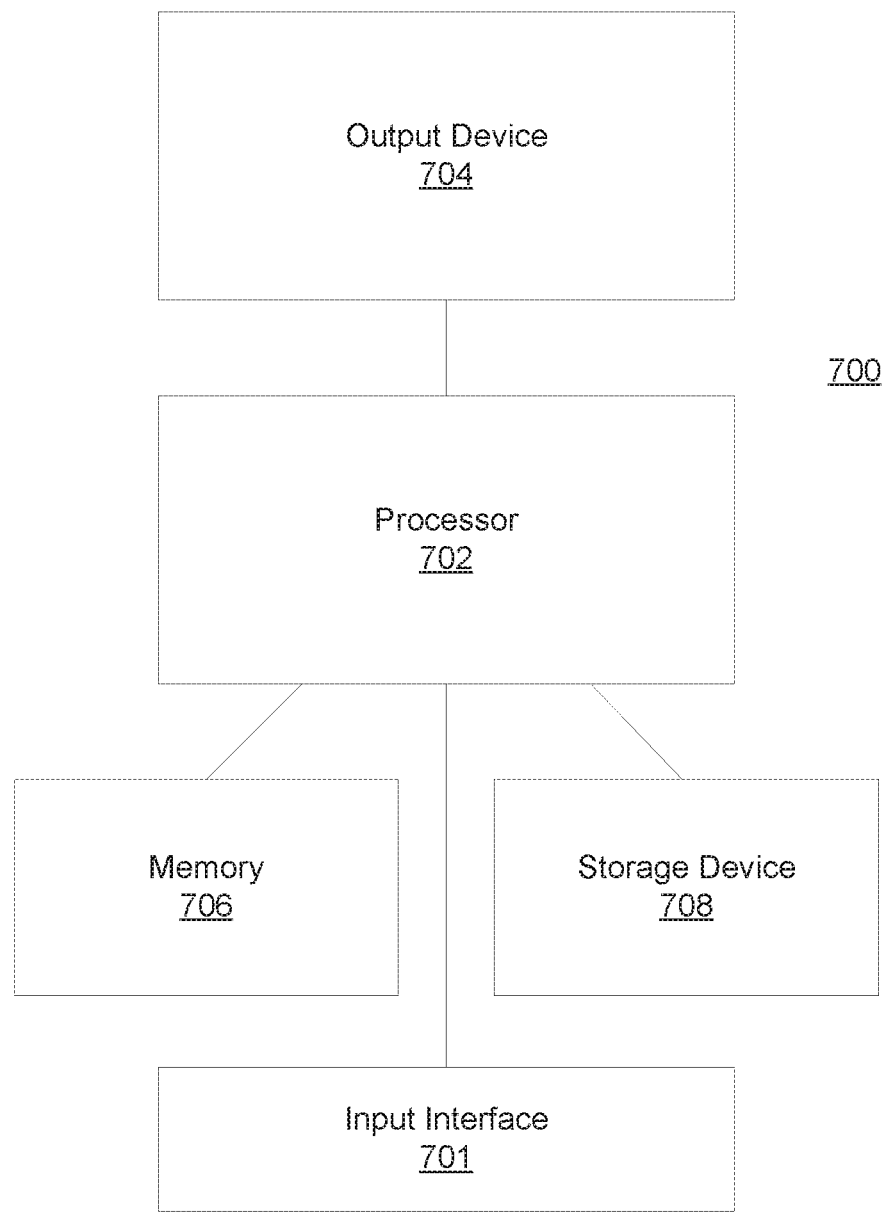
Figure 5:
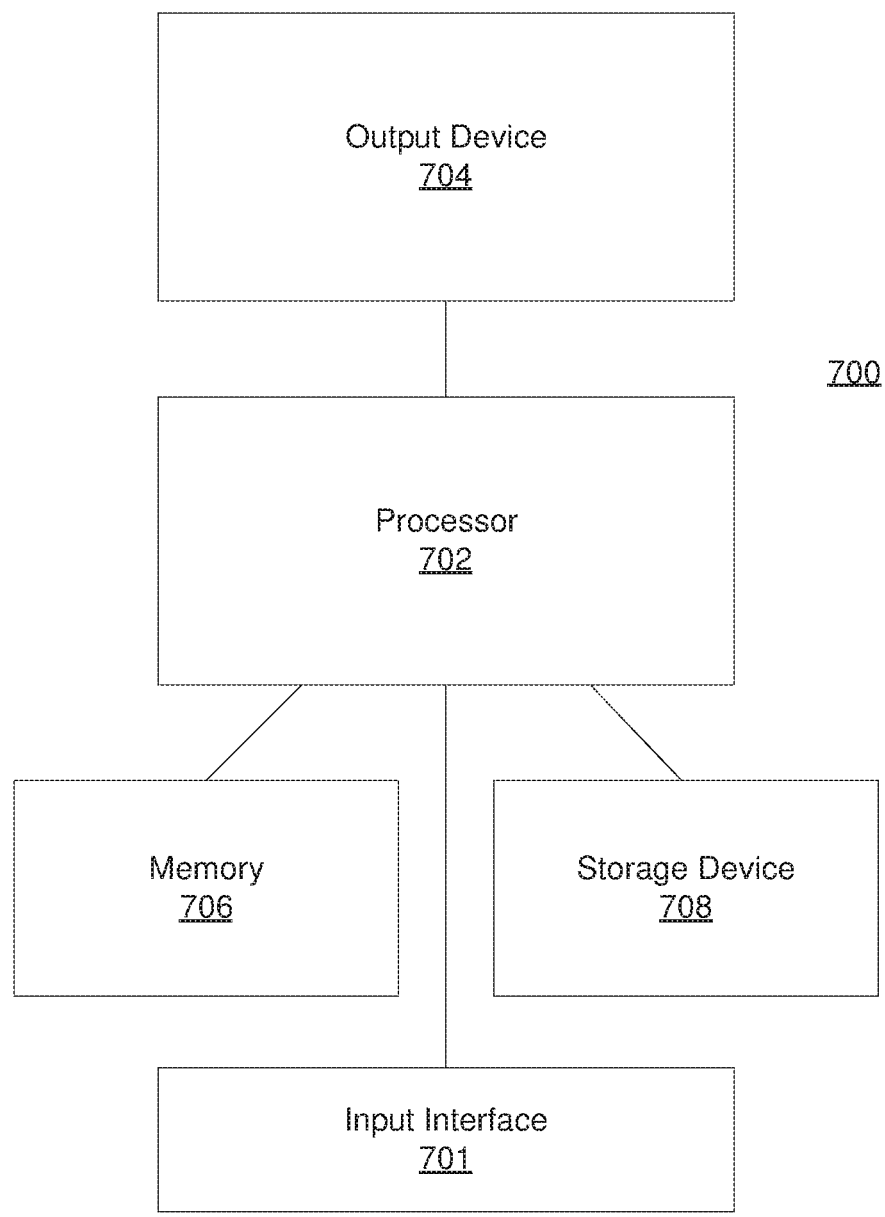

FIG. 5 illustrates a system 700 for generating post-silicon validation tests, according to some embodiments of the present invention. System 700 may include a processor 702 (e.g. single processor or a processing unit made that includes a plurality of processors, on a single machine or distributed on a plurality of machines) for executing a method according to some embodiments of the present invention. Processing unit 702 may be configured to obtain a selection of action scenarios from a set of scenarios originally constructed for generating simulation tests; to combine the selected scenarios into a combined scenario in which the selected scenarios are to be executed in parallel; and to generate a post-silicon test code corresponding to the combined scenario.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g. touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that when executed cause a processor to execute method steps in accordance with examples. In some examples the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system, or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for generating a validation test, the method comprising:

using a processor, identifying, in a combined scenario of a plurality of scenarios having different run times to be executed in parallel and in repeated loops, each scenario of the plurality of scenarios having been validated in simulation or emulation testing, the combined scenario for inclusion in a post silicon validation test of a system on chip (SOC), each scenario comprising one or more actions that are to be performed on the SOC, a plurality of the actions of different scenarios of the plurality of scenarios in one of the loops that concurrently address a single resource of the SOC, the single resource being limited to sequential addressing and comprising a memory address or a device of the SOC; and automatically by the processor generating target code of the validation test that includes one or a plurality of resource management commands, each of the resource management commands configured to prevent the concurrent addressing of the single resource by said plurality of the actions.

2. The method of claim 1, wherein said one or a plurality of resource management commands comprises one or more lock commands.

3. The method of claim 2, wherein said one or a plurality of lock commands are selected from the group consisting of an exclusive lock command, a shared lock command and a free command.

4. A non-transitory computer readable storage medium for generating a validation test, having stored thereon instructions that when executed by a processor will cause the processor to:

identify, in a combined scenario of a plurality of scenarios having different run times to be executed in parallel and in repeated loops, each scenario of the plurality of scenarios having been validated in simulation or emulation testing, the combined scenario for inclusion in a post silicon validation test of a system on chip (SOC), each scenario comprising one or more actions that are are to be performed on the SOC, a plurality of the actions of different scenarios of the plurality of scenarios in one of the loops that concurrently address a single resource of the SOC, the single resource being limited to sequential addressing and comprising a memory address or a device of the SOC; and automatically generate target code of the validation test that includes one or a plurality of resource management commands, each of the resource management commands configured to prevent the concurrent addressing of the single resource by said plurality of the actions.

5. The non-transitory computer readable storage medium of claim 4, wherein said one or a plurality of resource management commands comprises one or more lock commands.

6. The non-transitory computer readable storage medium of claim 5, wherein said one or a plurality of lock commands are selected from the group consisting of an exclusive lock command, a shared lock command and a free command.

7. A system for generating a validation test, the system comprising:

a memory and a processor configured to:

using a processor, identify, in a combined scenario of a plurality of scenarios having different run times to be executed in parallel and in repeated loops, each scenario of the plurality of scenarios having been validated in simulation or emulation testing, the combined scenario for inclusion in a post silicon validation test of a system on chip (SOC), each scenario comprising one or more actions that are to be performed on the SOC, a plurality of the actions of different scenarios of the plurality of scenarios in one of the loops that concurrently address a single resource of the SOC, the single resource being limited to sequential addressing and comprising a memory address or a device of the SOC; and automatically generate target code of the validation test that includes one or a plurality of resource management commands, each of the resource management commands configured to prevent the concurrent addressing of the single resource by said plurality of the actions.

8. The system of claim 7, wherein said one or a plurality of resource management commands comprises one or more lock commands.

9. The system of claim 8, wherein said one or a plurality of lock commands are selected from the group consisting of an exclusive lock command, a shared lock command and a free command.

* * * * *